US009835679B1

(12) United States Patent
Moret

(10) Patent No.: US 9,835,679 B1
(45) Date of Patent: Dec. 5, 2017

(54) SYSTEMS, METHODS, AND APPARATUSES FOR IMPLEMENTING FAST THROUGHPUT DIE HANDLING FOR SYNCHRONOUS MULTI-DIE TESTING

(71) Applicant: Intel Corporation, Santa Clara, CA (US)

(72) Inventor: Eric J. M. Moret, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,046

(22) Filed: Sep. 30, 2016

(51) Int. Cl.
G01R 31/28 (2006.01)
H01L 21/67 (2006.01)
H01L 21/68 (2006.01)
H01L 21/66 (2006.01)

(52) U.S. Cl.
CPC ..... *G01R 31/2887* (2013.01); *G01R 31/2891* (2013.01); *H01L 21/67242* (2013.01); *H01L 21/681* (2013.01); *H01L 22/14* (2013.01)

(58) Field of Classification Search
CPC ... G01N 23/225; G06K 9/3216; H04B 10/691
See application file for complete search history.

(56) References Cited

U.S. PATENT DOCUMENTS

2005/0190361 A1\* 9/2005 Ishiba .............. G01N 21/95684
356/237.2
2008/0238463 A1\* 10/2008 Takabe ............... G01R 31/2891
324/762.06
2011/0138506 A1\* 6/2011 Humphris .......... G01B 11/0608
850/6

\* cited by examiner

*Primary Examiner* — Jermele M Hollington
*Assistant Examiner* — Alvaro Fortich
(74) *Attorney, Agent, or Firm* — Schwabe Williamson & Wyatt P.C.

(57) ABSTRACT

In accordance with disclosed embodiments, there are provided systems, methods, and apparatuses for implementing fast throughput die handling for synchronous multi-die testing. For instance, there is disclosed in accordance with one embodiment a device handler for testing functional silicon devices, the device handler including: a plurality of test interface units to electrically interface to the functional silicon devices for test; a plurality of thermal actuators, each being individually movable upon at least three axes; an optical alignment unit with a plurality of pick and place head pairs, in which the optical alignment unit is to move upon a horizontal plane and is to move between the plurality of test interface units and the plurality of thermal actuators; an upward facing camera to move with the optical alignment unit, the upward facing camera to optically locate a position of the plurality of test interface units; a plurality of downward facing cameras, each to optically locate a position of one of the plurality of functional silicon devices to be tested upon one of the plurality of thermal actuators; in which the device handler is to move the optical alignment unit out from between the plurality of test interface units and the plurality of thermal actuators; and in which the device handler is to align test probes affixed to the test interface units with the plurality of functional silicon devices to be tested and electrically interface the test probes with the functional silicon devices for testing. Other related embodiments are disclosed.

25 Claims, 11 Drawing Sheets

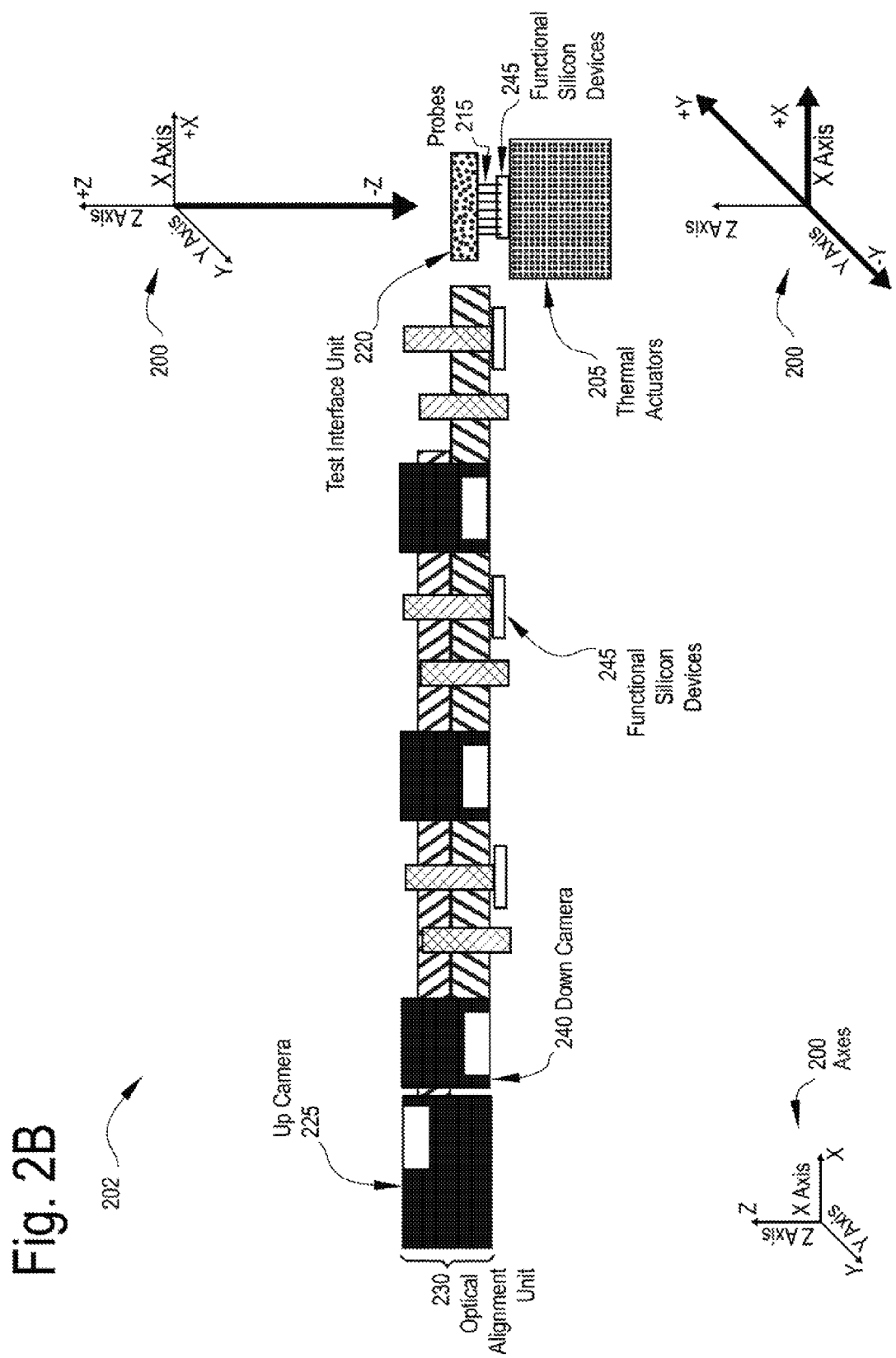

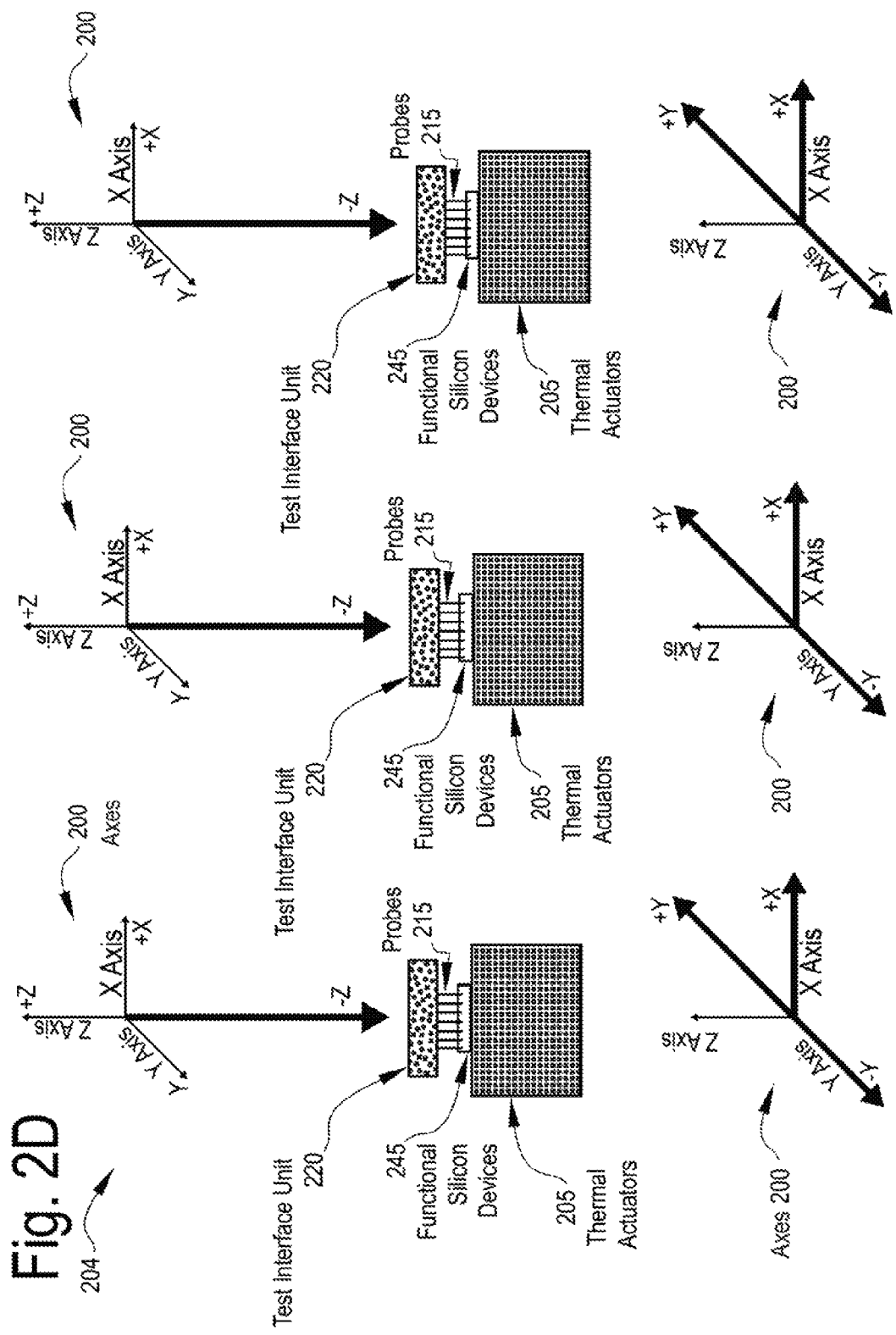

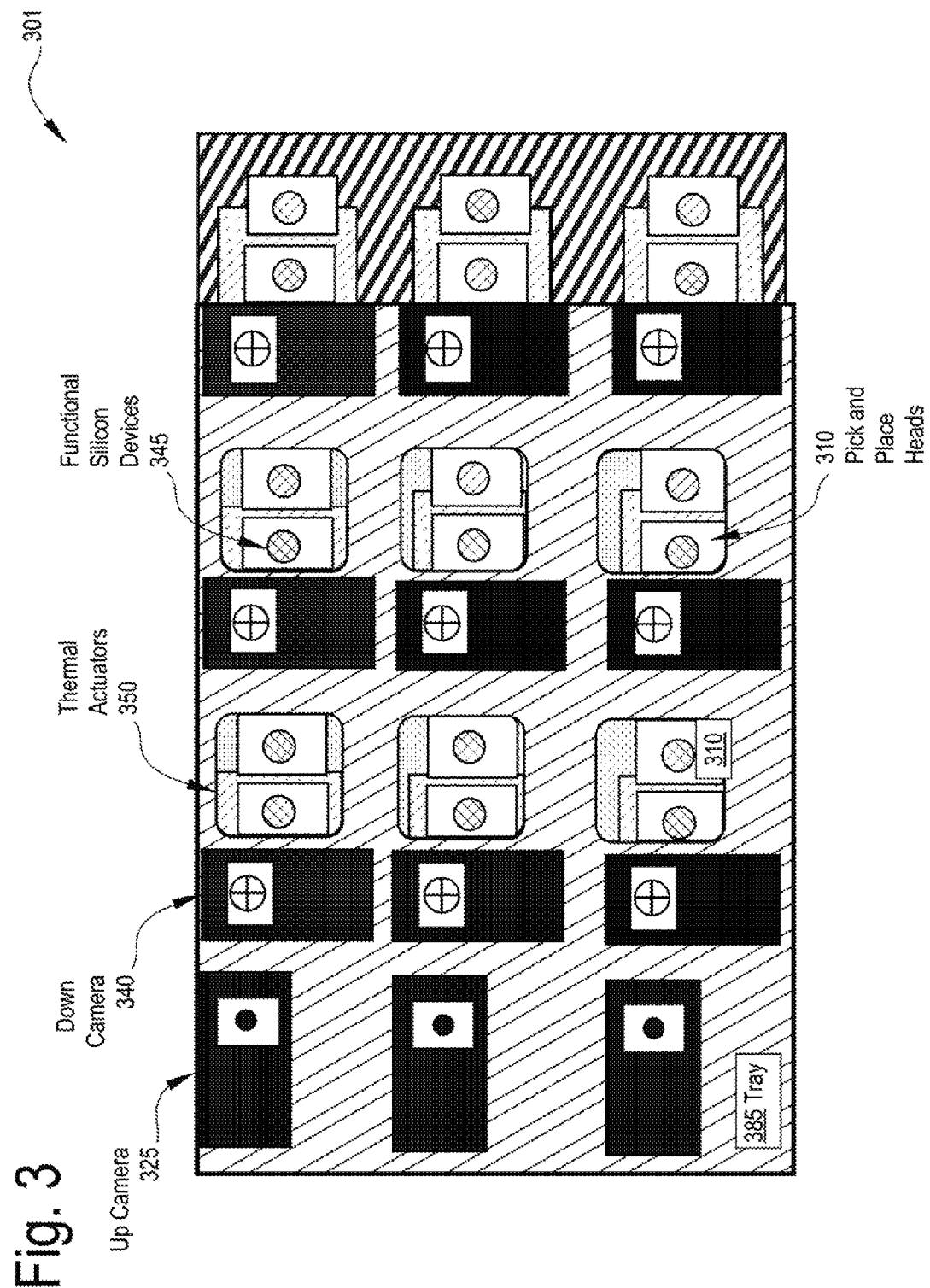

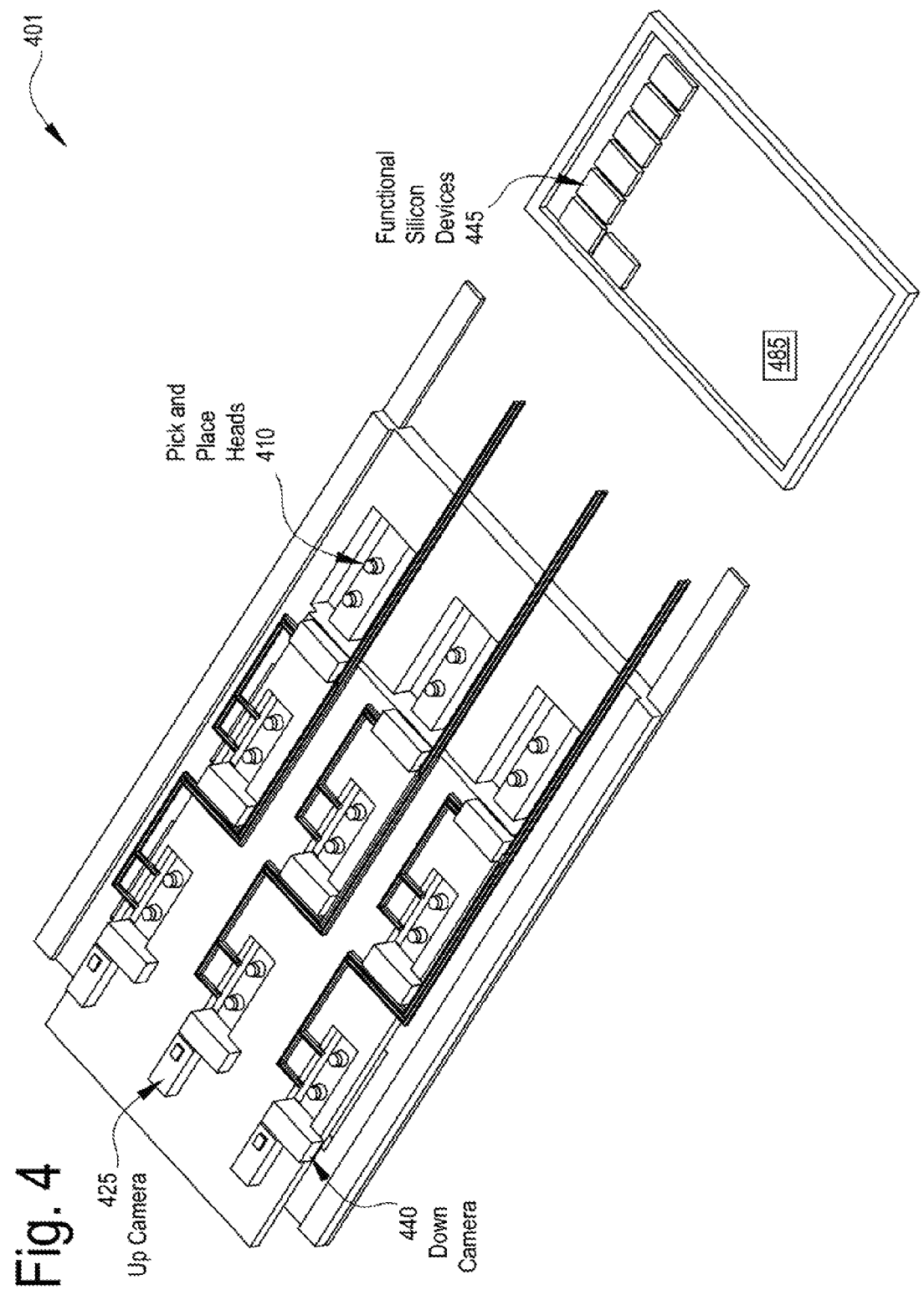

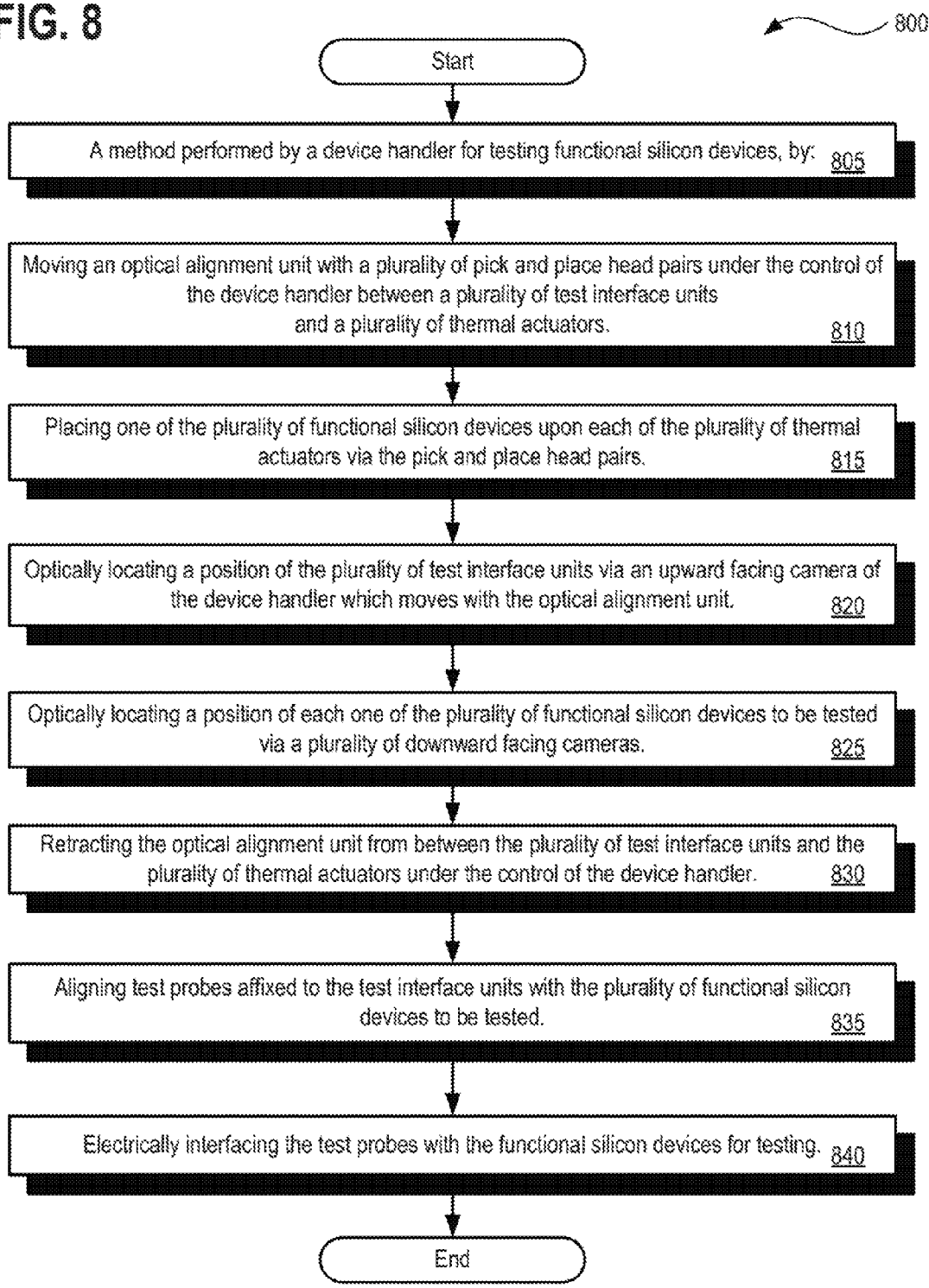

SYSTEMS, METHODS, AND APPARATUSES FOR IMPLEMENTING FAST THROUGHPUT DIE HANDLING FOR SYNCHRONOUS MULTI-DIE TESTING

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for systems, methods, and apparatuses for implementing fast throughput die handling for synchronous multi-die testing.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

In semiconductor manufacturing it is necessary to test the semiconductor dies or the functional semiconductor dies so as to verify they meet specifications and perform according to specifications.

Such testing is typically performed via Automatic Test Equipment (ATE), or "testers" against the manufactured semiconductor device or the "device under test" or (DUT).

The costs involved with testing the manufactured semiconductor devices can be substantial both in terms of capital equipment and procurement costs as well as in terms of the time it takes to test each individual unit under test.

The costs of testing contribute directly to the cost of the product and therefore affect whether any given product is financially viable in terms of economic performance it the marketplace.

The actual functional silicon may be tested at varying phases of production including prior to packaging meaning that small silicon wafers require testing via a test bed which introduces significant technical complexity to place and align such devices to the testing interfaces. Moreover, it can be time consuming to align each such silicon wafer to the testing apparatus and therefore production output may be limited by the testing capacity of the manufacturing line.

The present state of the art may therefore benefit from the means for implementing fast throughput die handling for synchronous multi-die testing as described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 2B depicts another exemplary test architecture in accordance with which embodiments may operate;

FIG. 2D depicts another exemplary test architecture in accordance with which embodiments may operate;

FIG. 3 depicts a top view of the exemplary optical alignment unit in accordance with which embodiments may operate;

FIG. 4 depicts a three-dimensional (3D) rendering of the Pick-and-Place (PNP) carrier tray and optical alignment unit assembly via a Computer Aided Design (CAD) drawing in accordance with which embodiments may operate;

FIG. 8 is a flow diagram illustrating a method for implementing fast throughput die handling for synchronous multi-die testing in accordance with described embodiments.

DETAILED DESCRIPTION

Figure 1:
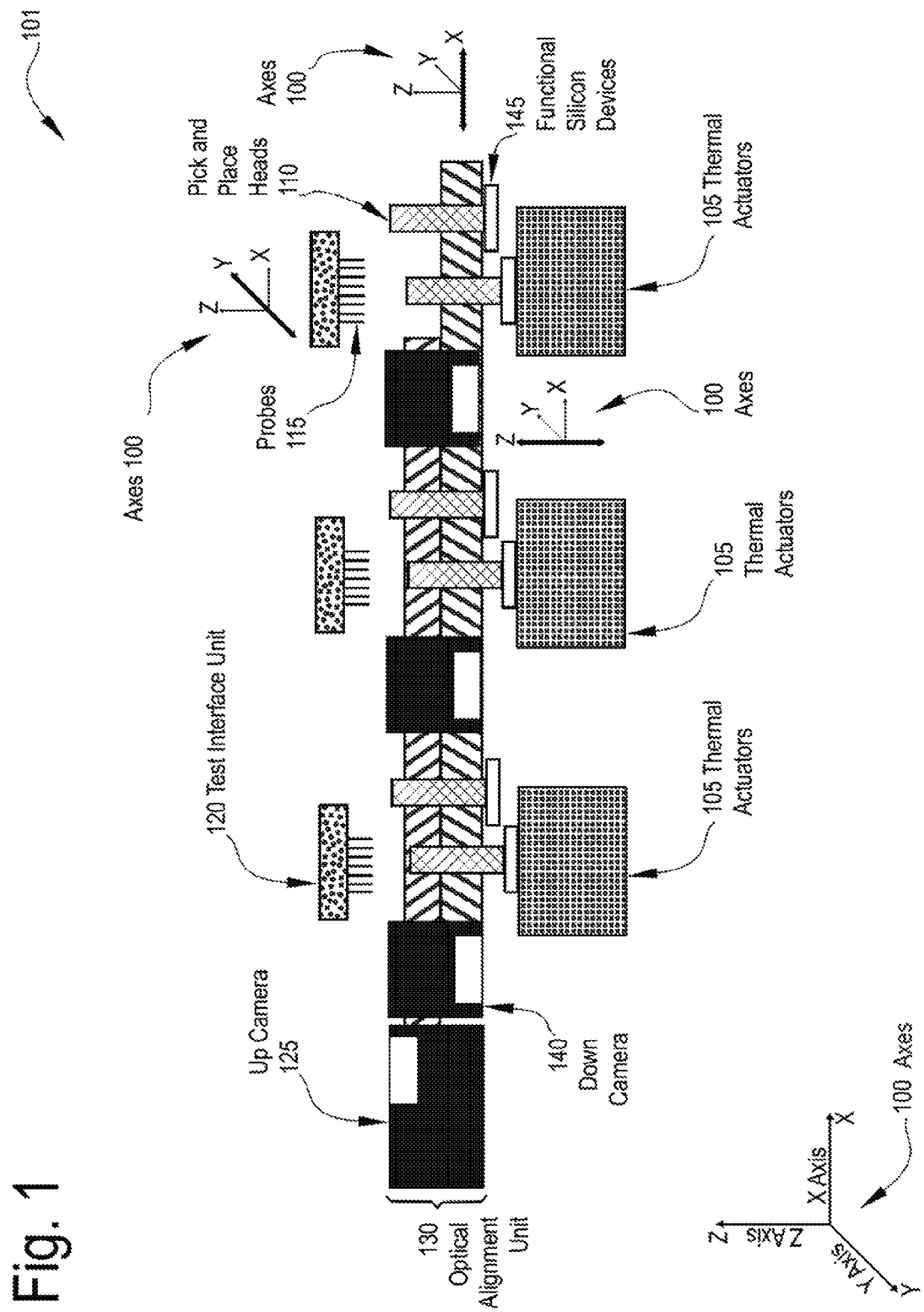
FIG. 1 depicts an exemplary test architecture in accordance with which embodiments may operate.

Described herein are systems, methods, and apparatuses for implementing fast throughput die handling for synchronous multi-die testing. For instance, there is disclosed in accordance with one embodiment a device handler for testing functional silicon devices, the device handler including: a plurality of test interface units to electrically interface to the functional silicon devices for test; a plurality of thermal actuators, each being individually movable upon at least three axes; an optical alignment unit with a plurality of pick and place head pairs, in which the optical alignment unit is to move upon a horizontal plane and is to move between the plurality of test interface units and the plurality of thermal actuators; an upward facing camera to move with the optical alignment unit, the upward facing camera to optically locate a position of the plurality of test interface units; a plurality of downward facing cameras, each to optically locate a position of one of the plurality of functional silicon devices to be tested upon one of the plurality of thermal actuators; in which the device handler is to move the optical alignment unit out from between the plurality of test interface units and the plurality of thermal actuators; and in which the device handler is to align test probes affixed to the test interface units with the plurality of functional silicon devices to be tested and electrically interface the test probes with the functional silicon devices for testing.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 depicts an exemplary test architecture 101 in accordance with which embodiments may operate.

In particular, there is depicted an optical alignment unit 130 which is positioned between test interface units 120 above and thermal actuators 105 below in relation to the X, Y, and Z axes 100 depicted where X is lateral left and lateral right on the horizontal plane, where Y is anterior and posterior (e.g., forward and backward or towards and away) on the horizontal plane, and where Z is up and down on the vertical plane.

Within the optical alignment unit 130 are a variety of apparatuses including an up camera 125, down cameras 140, and the pick and place heads 110 which operate to pick up and place down functional silicon devices 145 to and from the thermal actuators 105 below.

The optical alignment unit 130 depicted here moves laterally left and laterally right within the X-axis plane as depicted by the axes 100. The test interface units 120 move vertically up and down on the Z-axis to make contact with placed functional silicon devices 145 having been deposited upon the thermal actuators 105 below. Once the functional silicon devices 145 are placed onto the thermal actuators 105, the entire optical alignment unit 130 moves out of the way so that the test interface units 120 may drop to make contact with the functional silicon devices 145 now resting upon the thermal actuators. The thermal actuators 105 also have some limited degree of movement in the Y-axis (e.g., back and forth) and in the X-axis (e.g., laterally left and right) so as to permit very fine adjustment and alignment prior to the small test probes 115 of the test interface unit 120 making contact with the contacts of the functional silicon devices 145.

The test interface unit (TIU) 120 may also be referred to as a sort Interface Unit (SIU) or (xIU) or a "probe card." The test interface unit 120 is positioned and thermally controlled by a material handling equipment, "prober" for silicon wafers or a "handler" for individual semiconductor device units providing electrical and communicative interfacing from the test interface unit 120 into probe contacts on the functional silicon devices 145 regardless of whether they are in the form of wafers or individual semiconductor device units. Through such probe contacts the functional silicon device 145 is then subjected to a variety of tests.

Theoretically, by testing the functional silicon devices 145 against a known-good-die (KGD), it is possible fully test the functional silicon device 145 under test (DUT) and therefore guarantee its functionality prior to packaging, thus providing a cost-effective final packaged unit. Where a KGD and complete comprehensive testing is not feasible, test coverage is expanded to the extent permissible to ensure the functional silicon device 145 operates against its advertised performance metrics and specifications to a very high degree of confidence. Such comprehensive testing is especially desirable for multi-chip packages or where the resulting package cost is high.

Unfortunately, such comprehensive testing presents serious equipment challenges in a High Volume Manufacturing (HVM) environment where electrical connectivity, tight transistor junctions, thermal controls, and parallel testing requirements inevitably compete in the immediate vicinity of the functional silicon device 145 under test.

Consequently, to maintain cost effectiveness, it is sometimes necessary to make compromises, such as settling for a less than 100% known good die or by accepting higher testing costs so as to attain more comprehensive testing coverage, or both.

A "handler" unit which operates with singulated unit-based functional silicon devices 145 offers the best performance in terms over electrical stimuli (e.g., closeness to the DUT, full connectivity) and DUT thermal management, but such single unit handlers require significantly more device handling which in turn results in greater handling and test costs.

For certain testing operations, the excessive handling requirements for a single functional silicon device 145 under test may have handling times to pick and place and align the functional silicon device 145 with the test probes of the test interface unit that the handling time actually exceeds the time the functional silicon device 145 is undergoing test, therefore significantly slowing the production capabilities of such devices.

The optical alignment unit 130 depicted here permits a large number of singulated functional semiconductor device 145 units (e.g., individual units having already been separated from their wafer form) to be processed in parallel on an array of test sites within the same handler or "test cell" which translates directly into significantly shorter handling times to process the functional silicon devices 145 and therefore lowers the per-die test cost for testing against a known good die or for performing comprehensive functional silicon die test.

The optical alignment unit 130 depicted here depicts a 1×3 array of test sites for individual functional silicon devices, however, the optical alignment unit 130 can be made longer, e.g., with 4 or 5 or more test sites and multiple optical alignment units 130 may be joined to form a grid of test sites for the same handler or test cell, for instance, forming a 3×3 grid of test sites or a 4×4, or 5×5 grid, and so forth.

Moreover, the optical alignment unit 130 is backwards compatible with existing test technology components including High Density Modular Test (HDMT) type test interface units 120 and DaRTH type thermal actuator 105, thus enabling a multi-parallel testing flow through manufacturing test operations utilizing existing components.

The depicted optical alignment unit 130 directly addresses the problems in the present state of the art which require serial loading and unloading of functional silicon devices 145 onto the test sites, thus contributing to very large device handling times, even where test operations may be run in parallel. In such a serial load and unload system, each functional silicon device 145 must be picked and placed and then the very fine alignment operation must occur on a one by one basis. There are no mechanisms previously available which enable multiple functional silicon devices to be loaded in parallel and then have the fine alignment performed in parallel for the multiple devices, each of which being in their own slightly differing orientation to the small probes 115 of the test interface unit 120.

It is therefore in accordance with described embodiments that multiple functional semiconductor devices units may be loaded onto a thermal actuator in parallel by the pick and place heads 110 of the optical alignment unit after which fine alignment of the multiple singulated (e.g., non-wafer) functional semiconductor devices 145 may be performed also in parallel.

According to such an embodiment, the amount of time required to perform the loading and unloading of the multiple functional silicon devices 145 in parallel is the same as prior methods required to perform the identical actions for one single unit in the serial load/unload, and fine alignment process. Consequently, order of magnitude reductions in handling time may be realized through practice of the described embodiments.

Figure 2A:
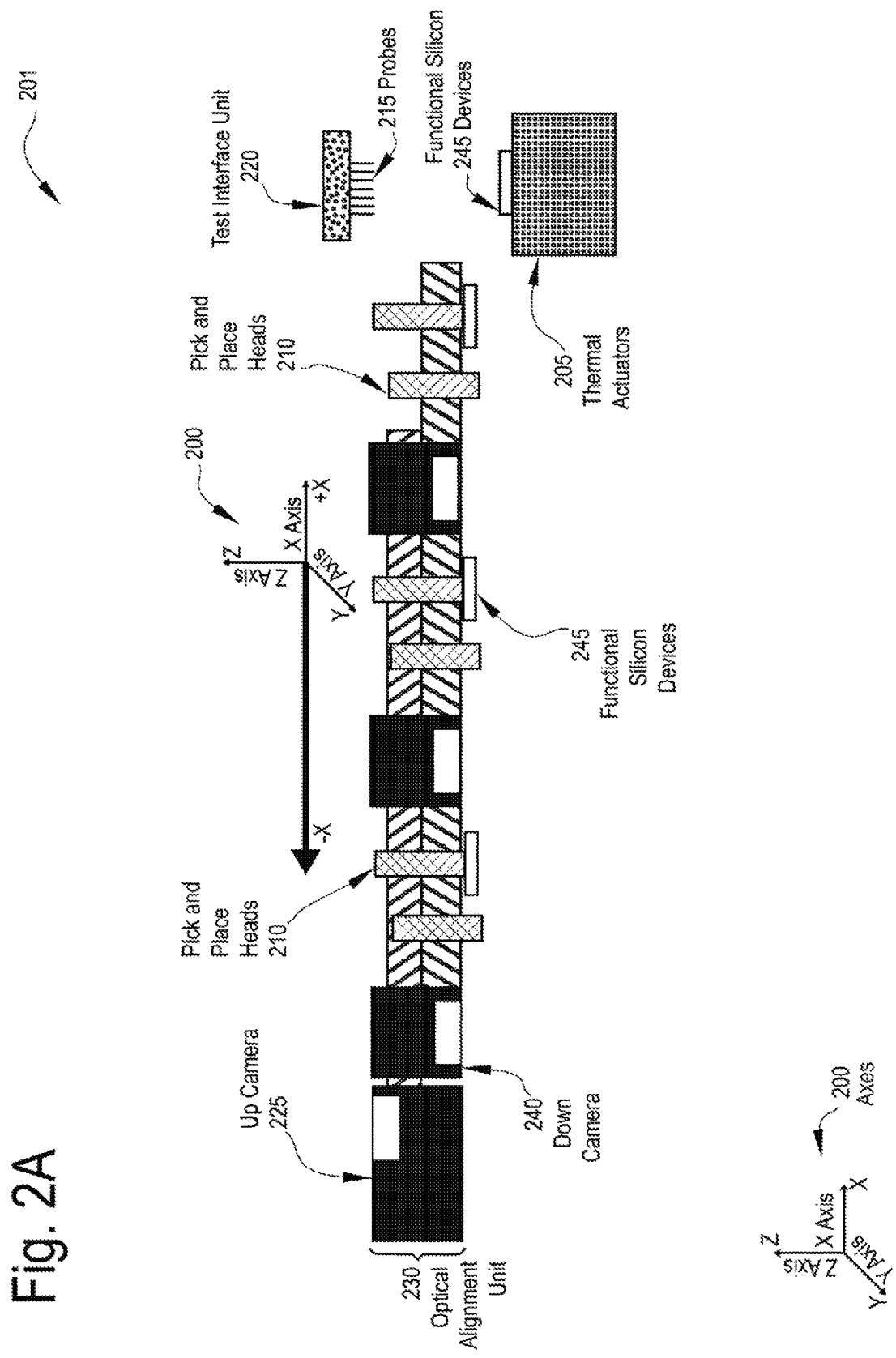
FIG. 2A depicts another exemplary test architecture in accordance with which embodiments may operate.

FIG. 2A depicts another exemplary test architecture 201 in accordance with which embodiments may operate.

In particular, there is again depicted an optical alignment unit 230 which is capable of movement on the X-axis to be positioned between test interface units 220 above and thermal actuators 205 below. However, as can be seen here, the optical alignment unit 230 has retracted away in the horizontal plane of the X-axis as depicted by axes 200, thus leaving nothing but empty space between the test interface unit 220 above and the thermal actuator 205 below. Consequently, the test interface unit 220 may now lower, thus connecting or electrically interfacing its probes 215 with the contacts of the functional silicon device 245 residing upon the thermal actuator 205 as shown.

Additionally depicted with the optical alignment unit 230 are the up camera 225, down cameras 240, and the pick and place heads 210 which operate to pick up and place down functional silicon devices 245 to and from the thermal actuators 205 below.

In accordance with a particular embodiment, the optical alignment unit 230 includes a low profile pick-and-place (PNP) tray which includes multiple PNP heads 210. According to a particular embodiment, the optical alignment unit 230 with its PNP tray having the array of PNP heads 210 therein is actuated in a single direction, moving for example in the horizontal plane to retract, thus moving the entire PNP tray out of the way of the thermal actuators and test interface units.

According to one embodiment, the optical alignment unit moves the entire PNP tray with the multiple PNP heads 210 between an R×C array of thermal actuators 205 and a corresponding set of test probe 215 arrays communicably interfaced with a probe card.

For instance, according to one embodiment each test site is served by pair of side-by-side PNP heads 210 where R=C=3 for a total of N=9 test sites, thus enabling 9 multiple individual functional silicon devices 245 to be moved in parallel, previously tested functional silicon devices 245 to be picked up by the PNP heads 210 in parallel, then untested tested functional silicon devices 245 to be placed upon the thermal actuators 205 by the PNP heads 210 in parallel, and then a fine alignment operation performed by the thermal actuators 205 to be performed in parallel, and then the lowering of the test interface units 220 connecting the respective test probes 215 to the various functional silicon devices 245 under test to be physically brought into contact with the probes 215 in parallel, and finally, for test to be executed against the devices under test in parallel.

According to described embodiments, fine alignment of the functional silicon devices 245 to the test probes 215 of the test interface units is driven by two sets of miniature cameras which visualize the probe array (e.g., R cameras) and the device interconnections from the functional silicon devices 245 to the test probes 215, thus utilizing (RxC=N cameras).

According to particular embodiments, third party provided alignment routines are utilized which take as input the optical imagery captured by the up camera 225 and the down cameras 240 and calibrate the optical alignment unit's 230 position with respect to the test interface units 220 above and additionally calibrates each thermal actuator's 205 position with respect to one or more corners of the functional silicon die and additionally optically captures via the down cameras 240 at each test site the contacts/interconnects of the functional silicon dies from which exact offsets from the corner or die edge may be computed to enable the thermal actuators to perform fine alignment (e.g., within several microns) of the functional silicon devices to the probes 215 of the test interface units.

According to described embodiments, the pick and place heads 210 perform a gross or macro alignment by positioning the functional silicon devices upon their thermal actuators within hundreds of microns and the thermal actuators subsequently perform fine alignment operations to bring the interconnects or contacts of the functional silicon devices to within several microns tolerance of the test probes 215 lowered with the test interface unit 220 at each test site within the test array.

According to one embodiment, the down camera 240 at each thermal actuator test site captures the position of two or more corners of the functional silicon die deposited onto the thermal actuator by the pick and place head for that test site and using the precise position of the functional silicon device on the thermal actuator, offsets to the contacts or interconnects of the functional silicon device are computed and the computed offsets are then utilized by the thermal actuator to perform final fine adjustment to within several (e.g., less than 20) microns in the XYZ-Theta directions. According to such an embodiment, the thermal actuators 205 each move independently in the XYZ-Theta directions to perform the fine alignment, subsequent to which the test probes are lowered to make physical and electrical contact with the functional silicon device's contacts or interconnects.

According to one embodiment, the optical alignment unit which carries the PNP tray and its PNP heads is actuated only in the direction perpendicular to the PNP tray and PNP heads. Therefore, the PNP heads which operate up and down strictly in the vertical plane are complemented by the movement of the optical alignment unit which operates strictly back and forth in the horizontal plane. In such a way, the combination of the vertical movement via the pick and place heads 210 and the horizontal movement of the optical alignment unit provides for gross alignment or macro-alignment of the functional silicon devices 245 which must be placed upon the top of the thermal actuators 205 below.

The optical alignment unit moves into position on the horizontal plane between the thermal actuator array to perform both device exchange and device alignment. The specific arrangement of the depicted components enables both the device exchange and the device alignment to be performed very quickly, with all functional silicon devices 245 being loaded concurrently (e.g., from a loading tray with functional silicon devices to be tested), retrieval of the previously tested functional silicon devices concurrently from each test site via one of the pair of pick and place arms at each site in the array, and then unloading of the next to be tested functional silicon devices concurrently which are carried by the second of the pair of pick and place arms which concurrently places the devices upon the thermal actuators 205.

The up-camera 225 is utilized to optically locate the test probes and test interface units 220 above so as to correctly align the optical alignment unit into position before depositing the functional silicon devices 245 which are to be tested upon the thermal actuators.

According to one embodiment there is one up-camera for the entire array of test sites handled by the optical alignment unit.

Each test site has its own corresponding down-camera which observes the individual thermal actuators 205 below. According to such embodiments, each of the thermal actuator has individual fine control movement in the X, Y, and Z (XYZ-Theta) directions with limited range, for instance, within approximately two millimeters in any direction.

According to certain embodiments, the Z direction has a significantly greater stroke, sufficient to move the thermal probe 215 completely out of the way such that the optical alignment unit may be inserted between the thermal probe and the test interface unit, for instance, with a degree of movement of approximately 25-30 mm.

According to described embodiments, the optical alignment unit integrates into a singulated die test handler cell on a semiconductor manufacturing line for use with Known-Good-Die (KGD) technologies.

Sinulation refers to the separation of the individual functional silicon dies from their wafer through a saw or cutting process as well as possibly grinding and smoothing operations. The individual functional silicon devices singulated or separated from their parent wafer may be tested as individual functional silicon dies without being incorporated into a semiconductor package or may further be packaged into semiconductor packages or a stacked semiconductor package having multiple such functional silicon dies therein and then the functional silicon device may be tested within its semiconductor package.

FIG. 2B depicts another exemplary test architecture 202 in accordance with which embodiments may operate.

In particular, there is again depicted the optical alignment unit 230 having been retracted away on the horizontal plane. With the optical alignment unit 230 removed the test interface unit may now lower in the vertical plane as depicted by axes 200 showing the lowering of the test interface unit 220 on the Z-axis 200. As shown here, the probes 215 of the test interface unit 220 have now connected with the contacts of the functional silicon device 245 (presently untested) which rests atop the thermal actuator 205.

As is further depicted, the thermal actuator 205 may be utilized for fine alignment and movement calibration as it has some limited movement in the Y-axis, and the X-axis. Depending on the model of the thermal actuator 205 the actuator may have some vertical movement as well.

Although a single functional silicon device 245 is illustrated here, all of the functional silicon devices 245 would be placed in parallel and the test interface units 205 would lower their probes 215 onto the multiple functional silicon devices 245 in parallel and the thermal actuators would conduct the fine alignment of the functional silicon devices 245 to the probes of the test interface units 220 in parallel.

Figure 2C:
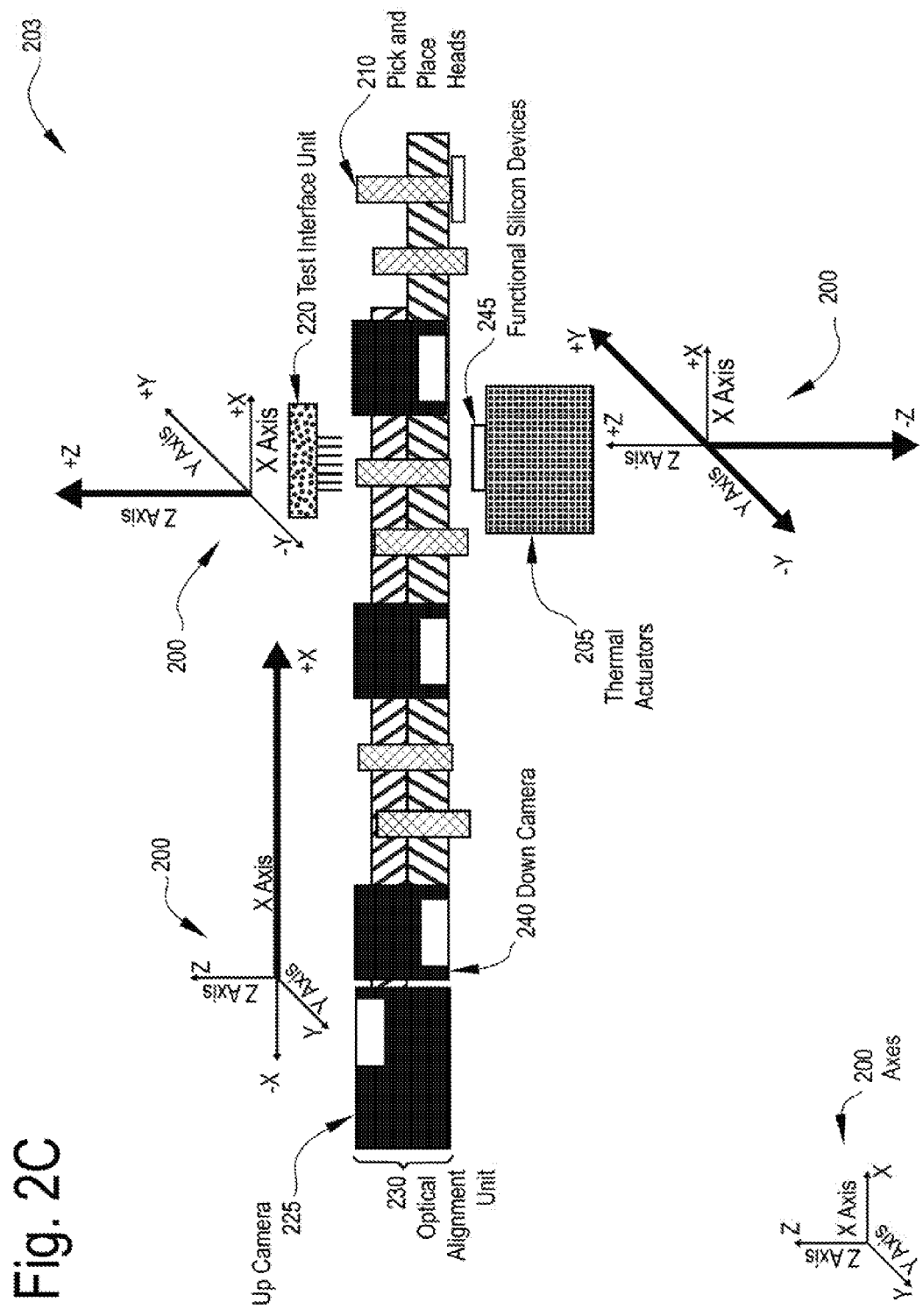
FIG. 2C depicts another exemplary test architecture in accordance with which embodiments may operate.

FIG. 2C depicts another exemplary test architecture 203 in accordance with which embodiments may operate.

As can be seen here, after the test sequence is executed against the functional silicon device 245 (now tested), the optical alignment unit moves back into position between the test interface unit 220 which is shown here as being raised back up and the thermal actuator which is shown here as below the optical alignment unit 230. Specifically, on the horizontal plane of the x-axis it is depicted that the optical alignment unit 230 is moved back into position.

The pick and place heads may now pick up the tested functional silicon device 245 from the top of the thermal actuator 205 and deposit a new untested functional silicon device 245 onto the top of the thermal actuator 205 to be re-aligned and reconnected to the test interface unit 220 for the next iteration of testing.

FIG. 2D depicts another exemplary test architecture 204 in accordance with which embodiments may operate.

In particular, it can be seen here that the optical alignment unit 230 has retracted away and now all three presently depicted functional silicon devices 245 may therefore be fine-aligned by the movement of the thermal actuator 205 array, such that each functional silicon device resting upon the respective thermal actuators 205 is individually, but in parallel, brought into correct alignment between the probes 215 of the test interface unit and the respective functional silicon device 245 under test at each of the thermal actuators 205.

The "fine alignment" operation is the process of alignment that enables the test probes 215 to correctly connect with the contacts of the functional silicon device 245 by providing device interconnect placement accuracy within a few micrometers or better as is required due to the very small contacts and tight tolerances within which the test probes 215 must connect with the device under test. A misalignment will either cause a short or a lack of connectivity with one or more of the contacts of the functional silicon device 245 under test, thus rendering any execution of a test sequence wholly useless.

Because the multiple depicted pick and place heads are able to place multiple functional silicon devices upon the multiple thermal actuators in parallel, the operation for the entire array of test sites takes approximately the same amount of time as one pick and placement operation with a serial tester. Moreover, because each of the thermal actuators 205 moves independently and performs their own respective fine alignment operation for their respectively placed functional silicon device 245, the fine alignment operation for the entire array again takes approximately the same amount of time as a fine alignment operation for a serial tester.

Prior solutions seeking to implement parallel alignment have relied upon one of two methodologies. First, prior solutions attempt to test at a non-singulated entire wafer level rather than testing the individual, separate and discreet functional silicon devices having already been singulated from their wafer. Second, prior solutions attempted which operate at the whole wafer level utilized mechanical alignment only.

There is no prior solution which provides for singulated die test of the individual functional silicon devices 245 where fine alignment placement must be on the order of micrometers. Relying upon the die edge alone, as is done with a mechanical alignment, is therefore not feasible due to the die edge to first level interconnect contact distance variability of the functional silicon devices. Stated differently, the margin or distance between the mechanical edge and the contacts of the functional silicon devices to which the very small test probes 215 must connect is not sufficiently reliable at this distances. The varying distance between the edge and the interconnects is great enough that mechanical alignment alone is not reliable.

FIG. 3 depicts a top view of the exemplary optical alignment unit 301 in accordance with which embodiments may operate.

The prior figures provide a side view illustration of the optical alignment unit 301 which now depicted from a top down view. The optical alignment unit 301 carries a tray 385 of pick and place heads 310, depicted here in a 3×3 array thus providing nine total test sites services by the individual optical alignment unit 301.

It may be further observed from the top view the up cameras 325, for which there is one per row of test sites, the down cameras 340, for which there is one down camera 340 for each test site enabling the fine alignment via the thermal actuators 350 below. Additionally depicted are the functional silicon devices 345 resting atop the thermal actuators 350.

In such a way, the optical alignment unit 301 integrates optical alignment capabilities and pick and place capabilities into a single unit providing a total handling time for unloading, loading, and alignment for N devices which is approximately equal to the unloading, loading, and alignment of a single device under test using serial testers. Here, the N devices corresponds to the nine depicted test sites provided via the 3×3 array of pick and place heads 310, thermal actuators 350 and down cameras 340 corresponding to each of the nine test sites.

The size of the test array for N devices, is only subject to the limitations on the number of sites that can be hosted by the tester and test interface in the physical space allotted at the test location. The size of the test array for N devices is not limited by any handling factor.

From the top view of the optical alignment unit, the entire tray 385 carrying the pick and place heads 310 will move left to right, with the pick and place heads moving up and down to lift and deposit the functional silicon devices 345 upon the thermal actuators. The thermal actuators move in the X, Y, and Z directions to perform fine alignment operations and also to permit the thermal actuators to lower down away from the optical alignment unit while in transit.

The test interface units are not depicted here as they would be above the viewing position of the top view of this optical alignment unit, but would lower down to bring the test probes into contact with the deposited functional silicon devices under test upon the thermal actuators once the optical alignment unit 301 retracts.

Because the optical alignment unit 301 is mounted upon tray 385, it is enabled to move back and forth on the horizontal plane thus permitting the up camera 325 and the down cameras 340 to reach to and observe the top edge of each functional, silicon device 345 and each respective test probe and test interface unit within the array.

According to a particular embodiment, the following sequence of operations would therefore occur: First, the PNP tray 385 moves in the horizontal plane over to a media holding tray (not shown here, refer to element 485 of FIG. 4) to pick up functional silicon devices 345 to be tested from the media holding tray.

Secondly, the PNP tray 385 via the optical alignment unit 301 shifts position to unload the previously tested functional silicon devices 345 carried by the opposite pick and place head 310 of each pick and place head pair at each test site, thus returning a now tested unit via operation two and retrieving the yet to be tested unit via operation one.

Thirdly, the PNP tray 385 via the optical alignment unit 301 moves back into position over the thermal actuators 350 where the pick and place heads 310 deposit the yet to be tested functional silicon device 345 onto the top surface of the thermal actuators 350 at each respective test site. The placement of the units on the thermal actuators at this stage may thus be considered a gross or macro alignment operation oriented by way of the up camera 325 which optically identifies the position of the test interface units and test probes which are immediately above the thermal actuators 350 in the vertical plane.

Fourthly, the down cameras 340 at each test site with an optical view of each functional silicon device 345 now deposited atop the thermal actuators are utilized to perform the fine alignment in which the thermal actuators are precisely moved based on the down camera 340 independent observations at each test site individually, thus permitting each thermal actuator which moves independently in the XYZ-Theta directions to precisely line up to at least one corner of the functional silicon device to be tested.

Fifth, an additional fine alignment phase is performed via the movement of the thermal actuators based upon calculated offsets for each functional silicon device 345 to be tested causing each thermal actuator at each test site to perform additional movement in the XYZ-Theta directions (e.g., adjusting all positions via the thermal actuators based on the calculated offsets) as necessary to precisely align the contacts of the functional silicon devices 345 to be tested now residing at each test site with the position of the test probes of the test interface device above each of the thermal actuators 350.

Notably, such fine alignment operations are conducted serially in prior solutions, thus causing significant delay and increased processing times on the production line for the handling of the functional silicon devices 345, even where the actual test sequence operation may be relatively short. Stated differently, the physical handling and alignment of the functional silicon devices 345 induces significant and costly delays when utilizing prior solutions, but are reduced by orders of magnitude by practicing the described embodiments which permit parallel handling and fine alignment operations of the functional silicon devices 345 on the production and manufacturing lines utilizing existing process flows and existing physical space allocated to such handling, alignment, and test operations.

According to certain embodiments fine alignment further includes individual pitch alignment of the thermal actuators in parallel to precisely align the pitch of the functional silicon device resting on top of the thermal actuator with the pitch of the test probes of the test interface unit. Such fine pitch alignment provides for even force distribution of the test probes which make physical contact with the contacts of the functional silicon device as well as ensure that all such contacts make a viable electrical/communications interface between the probes of the test interface and the contacts of the functional silicon device.

Such fine pitch alignment is especially helpful when testing semiconductor packages in which one or more functional silicon dies have been glued or bonded to a substrate or other surface resulting in potentially pitched or slanted surface. Lowering the test probes onto an uneven surface risks damage to the test probes, the test interface units, or the device under test, and therefore, the fine alignment additionally includes the pitch alignment in accordance with certain embodiments.

Additional operations may include, for example, at the very beginning of a new lot of yet to be tested functional silicon devices, the PNP tray 385 may index (e.g., calibrate) its X and Y position on the horizontal plane utilizing the up camera 325 to synchronize the position of the PNP tray and the optical alignment unit 301 to the array of test probes above.

During a production run, the optical alignment unit 301 need not move in the Y direction upon the horizontal plane more than once during the initial setup phase to prep for the first functional silicon devices to be tested. Stated differently, while the PNP tray and optical alignment unit will move laterally left and laterally right on the horizontal plane (x-axis) during each iteration of exchanging, alignment, and testing functional silicon devices, the PNP tray 385 need only move back and forth (in the anterior and posterior direction) once when the initial setup phase begins.

According to a particular embodiment, prior to starting a fine alignment phase for the functional silicon devices, the down cameras 340 are aligned to a top edge of the functional silicon devices 345 residing on the array of thermal actuators 350.

The pick and place tray 385 is sufficiently accurate to permit proper capture of the interconnects or contacts of the functional silicon devices 345 as observed by the down camera. Using the captured interconnects of the functional silicon devices via the down camera, the offsets may then be calculated permitting the thermal actuators to perform the final fine alignment operation bringing the test probes of the test interface units into precise alignment with the functional silicon device interconnects such that when the probes are lowered and make physical contact with the functional silicon devices 345 under test, the placement is exact and correct within tolerances which may be in the range of many micrometers.

At the beginning of a production run, prior to picking up a first functional silicon device for test, both pick and place heads will be empty. Thereafter, until the end of the run, one of the pairs of each pick and place head will carry either an untested functional silicon device retrieved from a media tray to be placed upon a thermal actuator or will carry a tested functional silicon device having been retrieved from one of the thermal actuators in the array to be returned to the media tray as a now tested device. By having a pair of pick and place heads, the PNP tray 385 is enabled to perform the exchange in less time as it must move between the array of thermal actuators and the media tray only once per iteration of media exchange (e.g., swapping the functional silicon devices) and alignment and test.

FIG. 4 depicts a three-dimensional (3D) rendering of the Pick-and-Place (PNP) carrier tray and optical alignment unit assembly 401 via a Computer Aided Design (CAD) drawing in accordance with which embodiments may operate.

In particular, there is depicted a pick and place tray which slides upon a horizontal plane left and right on the optical alignment unit assembly 401 with sufficient range to reach the functional silicon devices 445 residing on the media tray 485 where the pick and place heads 410 pick up and drop off untested and tested units under test respectively (e.g., exchanging tested functional silicon devices 445 for untested functional silicon devices 445) and then return by retracting again on the horizontal plane into position between the test interface units and test probe array above (not shown here) and the thermal actuator array below (not shown here).

The up camera 425 enables the optical alignment unit assembly 401 to capture its position relative to the test interface units and test probes and the down cameras 440, one located at each site within the test array (e.g., at each of the 3×3 depicted parallel handling locations) enables the optical alignment unit assembly 401 to capture the precise corner alignment of the deposited functional silicon devices 445 placed upon the thermal actuators by the pick and place heads 410 and additionally capture offsets for the interconnects/contacts of the functional silicon devices so that the thermal actuators which move in the XYZ-Theta directions may thus come into precise alignment, thus providing a 3×3 or nine position parallel handling and fine alignment operations to position the functional silicon devices 445 for testing.

According to certain embodiments, the media tray 485 (also called a magazine) has individually unique and cataloged positions for every one of the functional silicon devices on the media tray 485 and when the functional silicon devices are removed from the media tray 485 by the pick and place heads for test each respective functional silicon device is subsequently returned to its original position on the media tray 485. By returning the functional silicon devices 445 to the same position it is possible to trace and correlate which devices pass or fail the executed test sequence performed by the test interface unit and it is additionally possible to track which of the multiple functional silicon devices 445 have been tested or not tested as well as which are presently being carried by the optical alignment unit assembly 401 or are presently positioned upon the thermal actuators of the test array's multiple test sites.

The depicted media tray 485 carrying new batches of functional silicon devices may thus be swapped for completed batches of tested functional silicon devices 445 either via another mechanical operation or by human operator.

According to one embodiment each functional silicon device 445 includes a functional silicon die (e.g., such as a memory die or a logic die or a System on a Chip SOC die, etc.) as bare silicon which has not yet been packaged. In other embodiments, each functional silicon device 445 includes a semiconductor package having one or more functional silicon dies embedded thereupon, for instance, such as a package with a substrate, a Ball Grid Array (BGA) connecting the substrate with a functional silicon die and optionally one or more 3D vertically stacked functional silicon dies (e.g., such as additional memory or logic dies, etc.).

Additionally depicted are the vacuum lines and air lines coming from the pick and place heads which enable the pick and place heads to actuate up and down and also capture and pick up via negative vacuum pressure and then deposit the functional silicon devices without damaging them.

Figure 5:
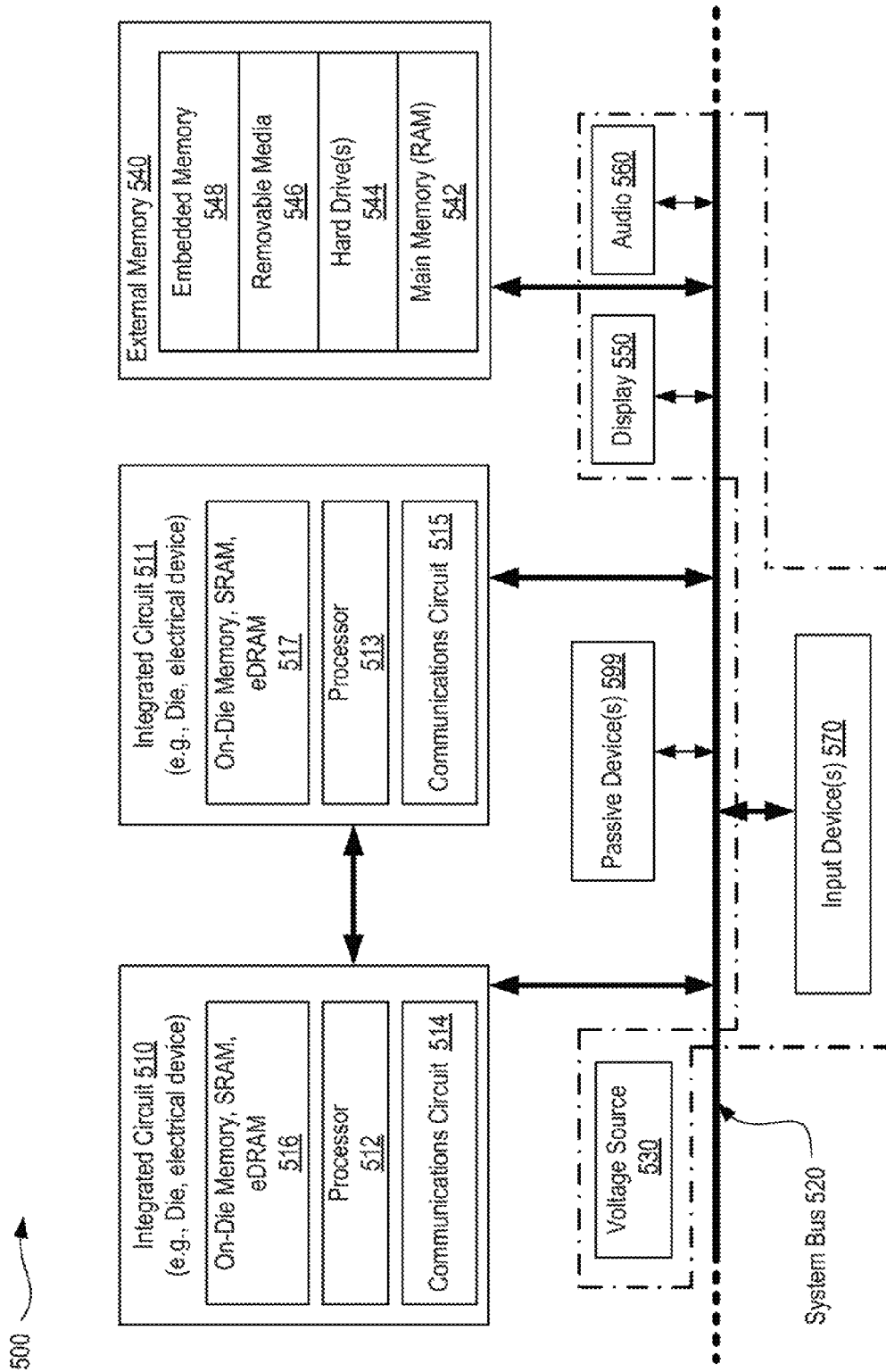
FIG. 5 is a schematic of a computer system in accordance with described embodiments.

FIG. 5 is a schematic of a computer system 500 in accordance with described embodiments. The computer system 500 (also referred to as the electronic system 500) as depicted can embody means for implementing fast throughput die handling for synchronous multi-die testing, according to any of the several disclosed embodiments and their equivalents as set forth in this disclosure. The computer system 500 may be a mobile device such as a net-book computer. The computer system 500 may be a mobile device such as a wireless smartphone or tablet. The computer system 500 may be a desktop computer. The computer system 500 may be a hand-held reader. The computer system 500 may be a server system. The computer system 500 may be a supercomputer or high-performance computing system.

In accordance with one embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

Such an integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical devices having gradient encapsulant protection, as disclosed herein.

In accordance with one embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In accordance with one embodiment, the integrated circuit 510 is complemented with a subsequent integrated circuit 511. Useful embodiments include a dual processor 513 and a dual communications circuit 515 and dual on-die memory 517 such as SRAM. In accordance with one embodiment, the dual integrated circuit 510 includes embedded on-die memory 517 such as eDRAM.

In one embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In accordance with one embodiment, the electronic system 500 also includes a display device 550 and an audio output 560. In one embodiment, the electronic system 500 includes an input device 570 such as a controller that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate means for implementing fast throughput die handling for synchronous multi-die testing, according to any of the several disclosed embodiments and their equivalents, an electronic system, a computer system, one or more methods of fabricating an integrated circuit, and one or more methods of fabricating an electronic assembly that includes a package substrate or means for implementing fast throughput die handling for synchronous multi-die testing, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and means for implementing fast throughput die handling for synchronous multi-die testing embodiments and their equivalents. A foundation substrate 598 may be included, as represented by the dashed line of FIG. 5. Passive devices 599 may also be included, as is also depicted in FIG. 5.

Figure 6:
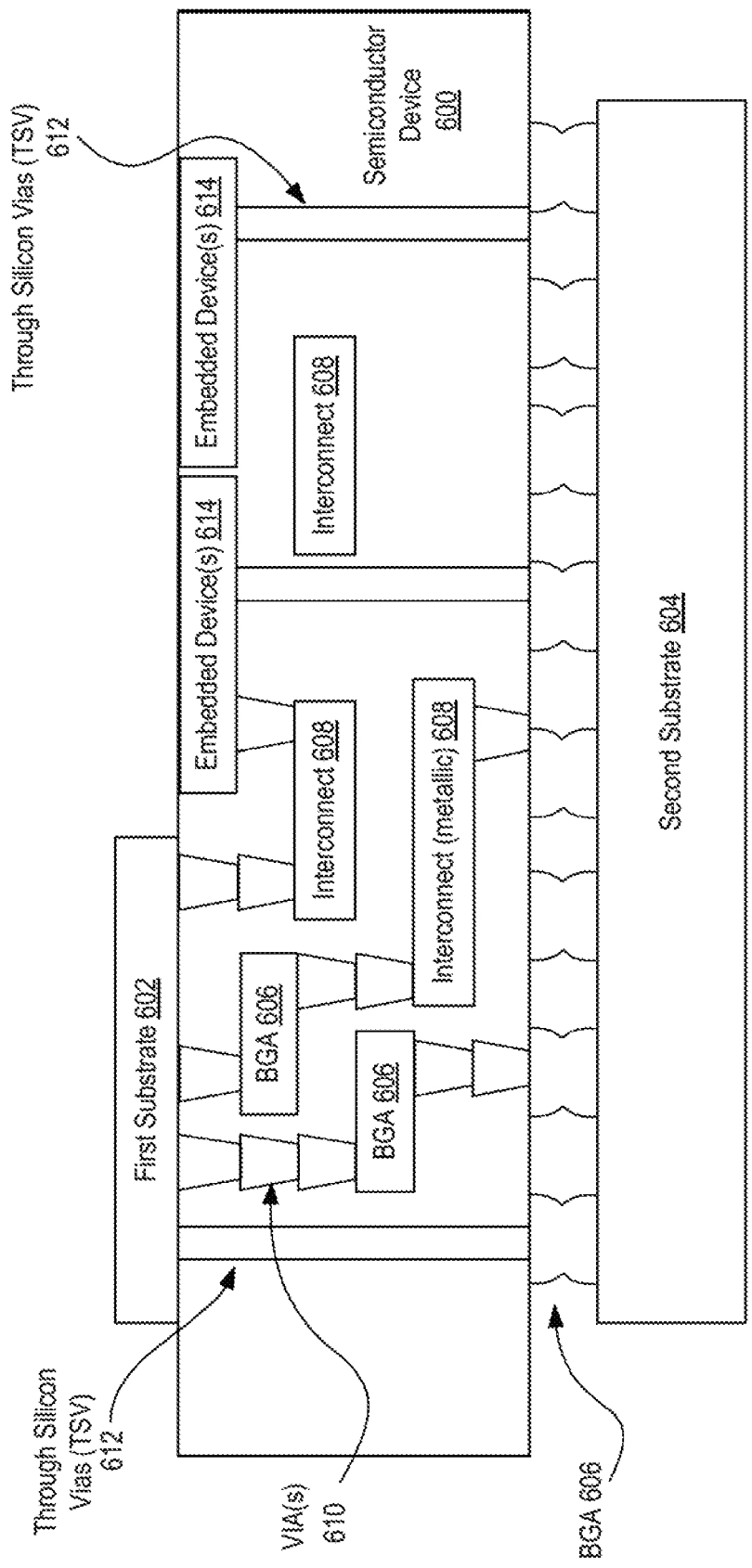
FIG. 6 illustrates an interposer that includes one or more described embodiments.

FIG. 6 illustrates an interposer 600 that includes one or more described embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with described embodiments, apparatuses or processes disclosed herein may be used in the fabrication of interposer 600.

Figure 7:
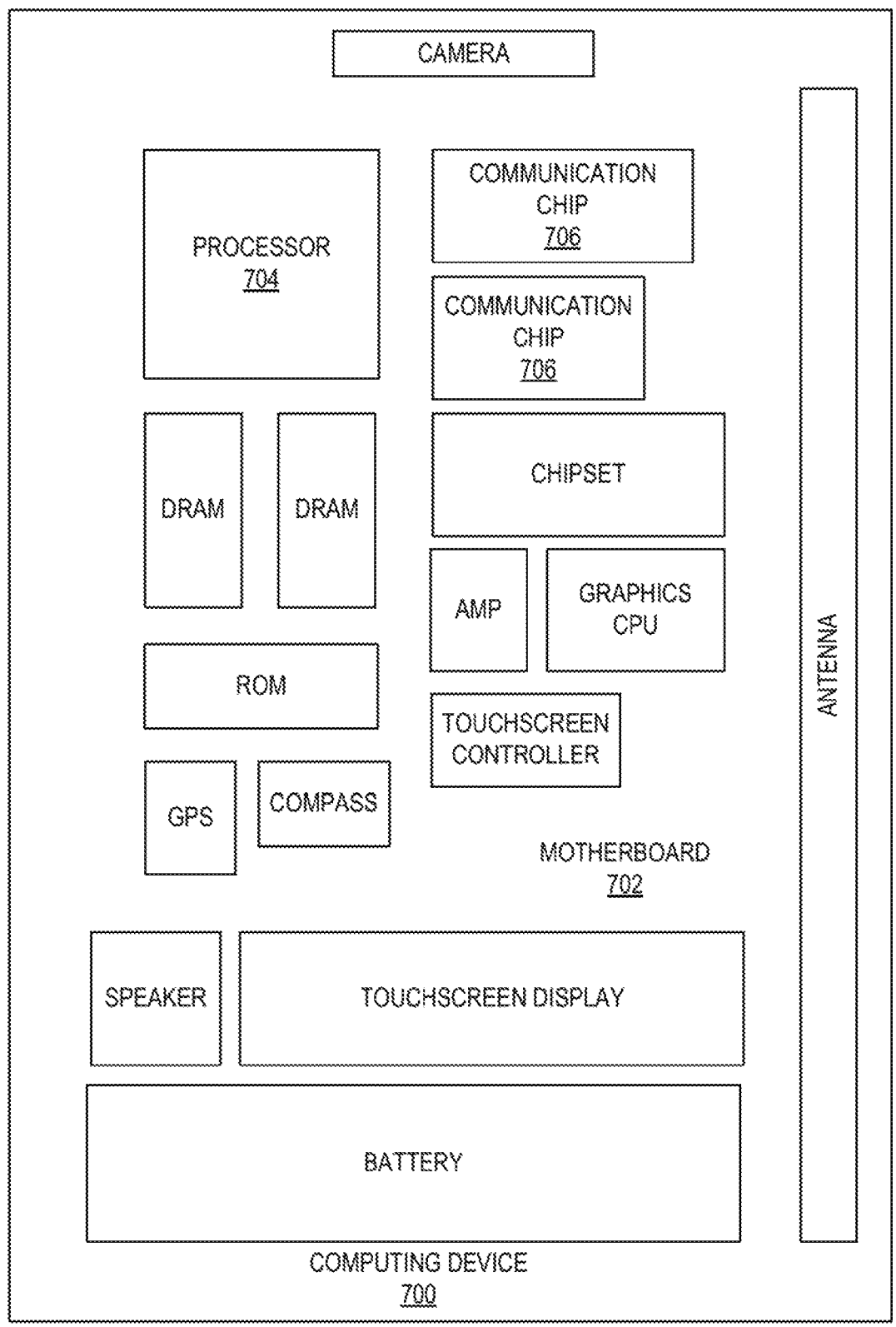
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

FIG. 8 is a flow diagram illustrating a method 800 for implementing fast throughput die handling for synchronous multi-die testing in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 800 may be utilized in a variety of combinations.

At block 805 the method 800 for implementing fast throughput die handling for synchronous multi-die testing begins with operations performed by a device handler for testing functional silicon devices, such operations including:

At block 810, the method 800 includes moving an optical alignment unit with a plurality of pick and place head pairs under the control of the device handler between a plurality of test interface units and a plurality of thermal actuators. According to such an embodiment, the optical alignment unit moves upon a horizontal plane, and in which the plurality of test interface units are to electrically interface to the functional silicon devices for test, and further in which each of the plurality of thermal actuators are individually movable upon at least three axes.

At block 815, the method 800 includes placing one of the plurality of functional silicon devices upon each of the plurality of thermal actuators via the pick and place head pairs.

At block 820, the method 800 includes optically locating a position of the plurality of test interface units via an upward facing camera of the device handler which moves with the optical alignment unit.

At block 825, the method 800 includes optically locating a position of each one of the plurality of functional silicon devices to be tested via a plurality of downward facing cameras.

At block 830, the method 800 includes retracting the optical alignment unit from between the plurality of test interface units and the plurality of thermal actuators under the control of the device handler.

At block 835, the method 800 includes aligning test probes affixed to the test interface units with the plurality of functional silicon devices to be tested.

At block 840, the method 800 includes electrically interfacing the test probes with the functional silicon devices for testing.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a device handler for testing functional silicon devices, the device handler including: a plurality of test interface units to electrically interface to the functional silicon devices for test; a plurality of thermal actuators, each being individually movable upon at least three axes; an optical alignment unit with a plurality of pick and place head pairs, in which the optical alignment unit is to move upon a horizontal plane and is to move between the plurality of test interface units and the plurality of thermal actuators; an upward facing camera to move with the optical alignment unit, the upward facing camera to optically locate a position of the plurality of test interface units; a plurality of downward facing cameras, each to optically locate a position of one of the plurality of functional silicon devices to be tested upon one of the plurality of thermal actuators; in which the device handler is to move the optical alignment unit out from between the plurality of test interface units and the plurality of thermal actuators; and in which the device handler is to align test probes affixed to the test interface units with the plurality of functional silicon devices to be tested and electrically interface the test probes with the functional silicon devices for testing.

According to another embodiment of the device handler, the optical alignment unit when positioned between the plurality of test interface units and the plurality of thermal actuators is positioned such that the plurality of test interface units are above the optical alignment unit and the plurality of thermal actuators are positioned below the optical alignment unit.

According to another embodiment of the device handler, the optical alignment unit to move upon a horizontal plane includes the optical alignment unit to move in at least two axes, including movement upon an X axis laterally left and laterally right and further including movement upon a Y axis anterior and posterior, and in which the optical alignment unit does not move upon a Z axis, vertically up or down.

According to another embodiment of the device handler, the plurality of thermal actuators being individually movable upon at least three axes includes each thermal actuator capable of movement upon three axes, including movement upon an X axis laterally left and laterally right and further including movement upon a Y axis anterior and posterior, and further including movement upon a Z axis vertically up and down.

According to another embodiment of the device handler, each thermal actuator is further capable of independent pitch adjustment relative to the plurality of test interface units having a fixed pitch; and in which the device handler to align test probes affixed to the test interface units with the plurality of functional silicon devices to be tested further includes the handler to align the test probes to the plurality of functional silicon devices by independently adjusting a pitch of each of the plurality of thermal actuators as controlled by the device handler based on inputs from the plurality of downward facing cameras; and in which the pitch of each of the plurality of thermal actuators is adjusted prior to the device handler electrically interfacing the test probes to the plurality of functional silicon devices to be tested.

According to another embodiment of the device handler, the device handler to electrically interface the test probes with the functional silicon devices for testing includes the device handler to lower the test interface units having the test probes affixed thereto in a vertical plane toward the thermal actuator units and to raise the thermal actuator units having the plurality of functional silicon devices to be tested set thereupon in the vertical plane toward the test probes of the test interface units.

According to another embodiment of the device handler, the device handler to bring the test probes into physical contact with electrical contacts of the functional silicon devices for testing to electrically interface each one of the plurality of test probes of the test interface units with one of the electrical contacts of the functional silicon devices to be tested.

According to another embodiment of the device handler, each of the plurality of downward facing cameras is to optically locate the position one of the plurality of functional silicon devices to be tested by performing a pattern recognition operation, in which the pattern recognition operation identifies a plurality of electrical interconnects of the respective functional silicon device.

According to another embodiment of the device handler, the pattern recognition operation to identify the plurality of electrical interconnects includes identifying upon the respective functional silicon device a plurality of functional silicon device electrical interconnect bumps or a plurality of First Level Interface (FLI) electrical connectors of the respective functional silicon device or a plurality of electrical contact pads of the respective functional silicon device.

According to another embodiment of the device handler, each of the plurality of downward facing cameras are to optically locate every position of the plurality of functional silicon devices having been placed upon the plurality of thermal actuators by the plurality of pick and place heads; and in which a position of the test interface units is known relative to each of the plurality of the functional silicon devices upon the thermal actuators by the combination of input from the upward facing camera and input from the plurality of downward facing cameras.

According to another embodiment of the device handler, the upward camera captures first input identifying the position of each of the plurality of test interface units; in which each of the downward facing cameras capture second input identifying the position of each of the plurality of functional silicon devices having been placed upon the plurality of thermal actuators; in which a pattern recognition operation identifies positions of a plurality of electrical contacts upon each of the plurality of functional silicon devices having been placed upon the plurality of thermal actuators based on the second input from the downward facing cameras; in which a position of each the plurality of electrical contacts of each of the functional silicon devices to be tested is known in relation to the plurality of test interface units; and in which each of the thermal actuators are individually moved by the device handler to align the test interface units with the position of the plurality of electrical contacts of each of the functional silicon devices to be tested.

According to another embodiment of the device handler, the test handler to move the plurality of thermal actuators individually includes the thermal actuators being moved individually to unique alignment positions but in parallel with all other thermal actuators of the test handler.

According to another embodiment of the device handler, the upward facing camera to move with the optical alignment unit includes the upward facing camera to be fixedly attached to the optical alignment unit and its movement to be controlled by the movement of the optical alignment unit under the control of the device handler.

According to another embodiment of the device handler, the upward facing camera to optically locate the position of the plurality of test interface units includes the upward facing camera to optically locate the position of the plurality of test interface units relative to the optical alignment unit; and in which the plurality of pick and place heads of the optical alignment unit are to further place the functional silicon devices to be tested upon the thermal actuators based at least in part on the identified position of the plurality of test interface units relative to the optical alignment unit.

According to another embodiment of the device handler, the pick and place units are to perform a macro alignment under the control of the device handler and based at least in part on the optically located position of the plurality of test interface units by the upward facing camera; and in which placement of the functional silicon devices to be tested upon the thermal actuators relative to the test interface units are within hundreds of microns of alignment after the macro alignment by the pick and place heads.

According to another embodiment of the device handler, the thermal actuators are to independently move to perform a fine alignment operation under the control of the device handler and based at least in part on the optically located position of each one of the plurality of functional silicon devices the plurality by the downward facing cameras; and in which electrical contacts of the functional silicon devices to be tested are brought into a fine alignment within tens of microns by the independent movement of the thermal actuators.

According to another embodiment of the device handler, a second fine alignment operation further adjusts the thermal actuators through independent movement under the control of the device handler based on optical capture and identification of a plurality of electrical contacts of the plurality of functional silicon devices and offsets to the plurality of electrical contacts of each of the functional silicon devices from one or more edges or corners of each of the functional silicon devices.

According to another embodiment, there is a method performed by a device handler for testing functional silicon devices, wherein such a method includes: moving an optical alignment unit with a plurality of pick and place head pairs under the control of the device handler between a plurality of test interface units and a plurality of thermal actuators, in which the optical alignment unit moves upon a horizontal plane, in which the plurality of test interface units are to electrically interface to the functional silicon devices for test, and further in which each of the plurality of thermal actuators are individually movable upon at least three axes; placing one of the plurality of functional silicon devices upon each of the plurality of thermal actuators via the pick and place head pairs; optically locating a position of the plurality of test interface units via an upward facing camera of the device handler which moves with the optical alignment unit; optically locating a position of each one of the plurality of functional silicon devices to be tested via a plurality of downward facing cameras; retracting the optical alignment unit from between the plurality of test interface units and the plurality of thermal actuators under the control of the device handler; aligning test probes affixed to the test interface units with the plurality of functional silicon devices to be tested; and electrically interfacing the test probes with the functional silicon devices for testing.

According to another embodiment of the method, the optical alignment unit when positioned between the plurality of test interface units and the plurality of thermal actuators is positioned such that the plurality of test interface units are above the optical alignment unit and the plurality of thermal actuators are positioned below the optical alignment unit; and in which the optical alignment unit to move upon a horizontal plane includes the optical alignment unit to move in at least two axes, including movement upon an X axis laterally left and laterally right and further including movement upon a Y axis anterior and posterior, and in which the optical alignment unit does not move upon a Z axis, vertically up or down.

According to another embodiment of the method, the plurality of thermal actuators being individually movable upon at least three axes includes each thermal actuator capable of movement upon three axes, including movement upon an X axis laterally left and laterally right and further including movement upon a Y axis anterior and posterior, and further including movement upon a Z axis vertically up and down.

According to another embodiment of the method, the electrically interfacing the test probes with the functional silicon devices for testing includes: lowering the test interface units having the test probes affixed thereto in a vertical plane toward the thermal actuator units under the control of the device handler; and raising the thermal actuator units having the plurality of functional silicon devices to be tested set thereupon in the vertical plane toward the test probes of the test interface units under the control of the device handler.

According to another embodiment, the method further includes: performing one or more alignment operations, each of the one or more alignment operations including at least one of: (i) a pitch alignment operation, in which each thermal actuator is further capable of independent pitch adjustment relative to the plurality of test interface units having a fixed pitch and in which the device handler is to align test probes affixed to the test interface units with the plurality of functional silicon devices to be tested further includes the handler to align the test probes to the plurality of functional silicon devices by independently adjusting a pitch of each of the plurality of thermal actuators as controlled by the device handler based on inputs from the plurality of downward facing cameras and in which the pitch of each of the plurality of thermal actuators is adjusted prior to the device handler electrically interfacing the test probes to the plurality of functional silicon devices to be tested; (ii) a macro alignment operation, in which the pick and place units are to perform the macro alignment under the control of the device handler and based at least in part on the optically located position of the plurality of test interface units by the upward facing camera and in which placement of the functional silicon devices to be tested upon the thermal actuators relative to the test interface units are within hundreds of microns of alignment after the macro alignment by the pick and place heads; (iii) a fine alignment operation, in which each of the thermal actuators are to independently move to perform the fine alignment operation in parallel under the control of the device handler and based at least in part on the optically located position of each one of the plurality of functional silicon devices the plurality by the downward facing cameras and in which electrical contacts of the functional silicon devices to be tested are brought into a fine alignment within tens of microns by the independent movement of the thermal actuators; and a second fine alignment operation, in which the second fine alignment operation further adjusts the thermal actuators through independent movement under the control of the device handler based on optical capture and identification of a plurality of electrical contacts of the plurality of functional silicon devices and offsets to the plurality of electrical contacts of each of the functional silicon devices from one or more edges or corners of each of the functional silicon devices.

According to another embodiment there is a device handling system, including: a non-transitory computer readable media having instructions stored thereupon; a processor to execute the instructions; a plurality of test interface units to electrically interface to the functional silicon devices for test; a plurality of thermal actuators, each being individually movable upon at least three axes; an optical alignment unit with a plurality of pick and place head pairs, in which the optical alignment unit is to move upon a horizontal plane and is to move between the plurality of test interface units and the plurality of thermal actuators; an upward facing camera to move with the optical alignment unit, the upward facing camera to optically locate a position of the plurality of test interface units; a plurality of downward facing cameras, each to optically locate a position of one of the plurality of functional silicon devices to be tested upon one of the plurality of thermal actuators; in which the instructions, when executed by the processor of the system, cause the optical alignment unit to perform operations including: moving the optical alignment unit between the plurality of test interface units and the plurality of thermal actuators; placing one of the plurality of functional silicon devices upon each of the plurality of thermal actuators via the pick and place head pairs; optically locating a position of the plurality of test interface units via an upward facing camera of the device handler which moves with the optical alignment unit; optically locating a position of each one of the plurality of functional silicon devices to be tested via a plurality of downward facing cameras; retracting the optical alignment unit from between the plurality of test interface units and the plurality of thermal actuators under the control of the device handler; aligning test probes affixed to the test interface units with the plurality of functional silicon devices to be tested; and electrically interfacing the test probes with the functional silicon devices for testing.

According to another embodiment of the device handling system, the optical alignment unit when positioned between the plurality of test interface units and the plurality of thermal actuators is positioned such that the plurality of test interface units are above the optical alignment unit and the plurality of thermal actuators are positioned below the optical alignment unit; and in which the optical alignment unit to move upon a horizontal plane includes the optical alignment unit to move in at least two axes, including movement upon an X axis laterally left and laterally right and further including movement upon a Y axis anterior and posterior, and in which the optical alignment unit does not move upon a Z axis, vertically up or down.

According to another embodiment of the device handling system, electrically interfacing the test probes with the functional silicon devices for testing includes the instructions causing the optical alignment unit to perform further operations including: lowering the test interface units having the test probes affixed thereto in a vertical plane toward the thermal actuator units under the control of the device handler; and raising the thermal actuator units having the plurality of functional silicon devices to be tested set thereupon in the vertical plane toward the test probes of the test interface units under the control of the device handler.

What is claimed is:

1. A device handler for testing functional silicon devices, the device handler comprising:
a plurality of test interface units to electrically interface to the functional silicon devices for test;
a plurality of thermal actuators, each being individually movable upon at least three axes;
an optical alignment unit with a plurality of pick and place head pairs, wherein the optical alignment unit is to move upon a horizontal plane and is to move between the plurality of test interface units and the plurality of thermal actuators;
an upward facing camera to move with the optical alignment unit, the upward facing camera to optically locate a position of the plurality of test interface units;
a plurality of downward facing cameras, each to optically locate a position of one of the plurality of functional silicon devices to be tested upon one of the plurality of thermal actuators;
wherein the device handler is to move the optical alignment unit out from between the plurality of test interface units and the plurality of thermal actuators; and
wherein the device handler is to align test probes affixed to the test interface units with the plurality of functional silicon devices to be tested and electrically interface the test probes with the functional silicon devices for testing.

2. The device handler of claim 1, wherein the optical alignment unit when positioned between the plurality of test interface units and the plurality of thermal actuators is positioned such that the plurality of test interface units are above the optical alignment unit and the plurality of thermal actuators are positioned below the optical alignment unit.

3. The device handler of claim 1, wherein the optical alignment unit to move upon a horizontal plane comprises the optical alignment unit to move in at least two axes, including movement upon an X axis laterally left and laterally right and further including movement upon a Y axis anterior and posterior, and wherein the optical alignment unit does not move upon a Z axis, vertically up or down.

4. The device handler of claim 1, wherein the plurality of thermal actuators being individually movable upon at least three axes comprises each thermal actuator capable of movement upon three axes, including movement upon an X axis laterally left and laterally right and further including movement upon a Y axis anterior and posterior, and further including movement upon a Z axis vertically up and down.

5. The device handler of claim 1:
wherein each thermal actuator is further capable of independent pitch adjustment relative to the plurality of test interface units having a fixed pitch; and
wherein the device handler to align test probes affixed to the test interface units with the plurality of functional silicon devices to be tested further comprises the handler to align the test probes to the plurality of functional silicon devices by independently adjusting a pitch of each of the plurality of thermal actuators as controlled by the device handler based on inputs from the plurality of downward facing cameras; and
wherein the pitch of each of the plurality of thermal actuators is adjusted prior to the device handler electrically interfacing the test probes to the plurality of functional silicon devices to be tested.

6. The device handler of claim 1, wherein the device handler to electrically interface the test probes with the functional silicon devices for testing comprises the device handler to lower the test interface units having the test probes affixed thereto in a vertical plane toward the thermal actuator units and to raise the thermal actuator units having the plurality of functional silicon devices to be tested set thereupon in the vertical plane toward the test probes of the test interface units.

7. The device handler of claim 1, wherein the device handler to bring the test probes into physical contact with electrical contacts of the functional silicon devices for testing to electrically interface each one of the plurality of test probes of the test interface units with one of the electrical contacts of the functional silicon devices to be tested.

8. The device handler of claim 1, wherein each of the plurality of downward facing cameras is to optically locate the position one of the plurality of functional silicon devices to be tested by performing a pattern recognition operation, wherein the pattern recognition operation identifies a plurality of electrical interconnects of the respective functional silicon device.

9. The device handler of claim 8, wherein the pattern recognition operation to identify the plurality of electrical interconnects comprises identifying upon the respective functional silicon device a plurality of functional silicon device electrical interconnect bumps or a plurality of First Level Interface (FLI) electrical connectors of the respective functional silicon device or a plurality of electrical contact pads of the respective functional silicon device.

10. The device handler of claim 1:
wherein each of the plurality of downward facing cameras are to optically locate every position of the plurality of functional silicon devices having been placed upon the plurality of thermal actuators by the plurality of pick and place heads; and
wherein a position of the test interface units is known relative to each of the plurality of the functional silicon devices upon the thermal actuators by the combination of input from the upward facing camera and input from the plurality of downward facing cameras.

11. The device handler of claim 1:
wherein the upward camera captures first input identifying the position of each of the plurality of test interface units;
wherein each of the downward facing cameras capture second input identifying the position of each of the plurality of functional silicon devices having been placed upon the plurality of thermal actuators;
wherein a pattern recognition operation identifies positions of a plurality of electrical contacts upon each of the plurality of functional silicon devices having been placed upon the plurality of thermal actuators based on the second input from the downward facing cameras;
wherein a position of each the plurality of electrical contacts of each of the functional silicon devices to be tested is known in relation to the plurality of test interface units; and
wherein each of the thermal actuators are individually moved by the device handler to align the test interface units with the position of the plurality of electrical contacts of each of the functional silicon devices to be tested.

12. The device handler of claim 11, wherein the test handler to move the plurality of thermal actuators individually comprises the thermal actuators being moved individually to unique alignment positions but in parallel with all other thermal actuators of the test handler.

13. The device handler of claim 1, wherein the upward facing camera to move with the optical alignment unit comprises the upward facing camera to be fixedly attached to the optical alignment unit and its movement to be controlled by the movement of the optical alignment unit under the control of the device handler.

14. The device handler of claim 1:
wherein the upward facing camera to optically locate the position of the plurality of test interface units comprises the upward facing camera to optically locate the position of the plurality of test interface units relative to the optical alignment unit; and
wherein the plurality of pick and place heads of the optical alignment unit are to further place the functional silicon devices to be tested upon the thermal actuators based at least in part on the identified position of the plurality of test interface units relative to the optical alignment unit.

15. The device handler of claim 1:
wherein the pick and place units are to perform a macro alignment under the control of the device handler and based at least in part on the optically located position of the plurality of test interface units by the upward facing camera; and
wherein placement of the functional silicon devices to be tested upon the thermal actuators relative to the test interface units are within hundreds of microns of alignment after the macro alignment by the pick and place heads.

16. The device handler of claim 1:
wherein the thermal actuators are to independently move to perform a fine alignment operation under the control of the device handler and based at least in part on the optically located position of each one of the plurality of functional silicon devices the plurality by the downward facing cameras; and
wherein electrical contacts of the functional silicon devices to be tested are brought into a fine alignment within tens of microns by the independent movement of the thermal actuators.

17. The device handler of claim 16:
wherein a second fine alignment operation further adjusts the thermal actuators through independent movement under the control of the device handler based on optical capture and identification of a plurality of electrical contacts of the plurality of functional silicon devices and offsets to the plurality of electrical contacts of each of the functional silicon devices from one or more edges or corners of each of the functional silicon devices.

18. A method performed by a device handler for testing functional silicon devices, the method comprising:
moving an optical alignment unit with a plurality of pick and place head pairs under the control of the device handler between a plurality of test interface units and a plurality of thermal actuators, wherein the optical alignment unit moves upon a horizontal plane, wherein the plurality of test interface units are to electrically interface to the functional silicon devices for test, and further wherein each of the plurality of thermal actuators are individually movable upon at least three axes;
placing one of the plurality of functional silicon devices upon each of the plurality of thermal actuators via the pick and place head pairs;
optically locating a position of the plurality of test interface units via an upward facing camera of the device handler which moves with the optical alignment unit;
optically locating a position of each one of the plurality of functional silicon devices to be tested via a plurality of downward facing cameras;
retracting the optical alignment unit from between the plurality of test interface units and the plurality of thermal actuators under the control of the device handler;
aligning test probes affixed to the test interface units with the plurality of functional silicon devices to be tested; and
electrically interfacing the test probes with the functional silicon devices for testing.

19. The method of claim 18:
wherein the optical alignment unit when positioned between the plurality of test interface units and the plurality of thermal actuators is positioned such that the plurality of test interface units are above the optical alignment unit and the plurality of thermal actuators are positioned below the optical alignment unit; and
wherein the optical alignment unit to move upon a horizontal plane comprises the optical alignment unit to move in at least two axes, including movement upon an X axis laterally left and laterally right and further including movement upon a Y axis anterior and posterior, and wherein the optical alignment unit does not move upon a Z axis, vertically up or down.

20. The method of claim 18, wherein the plurality of thermal actuators being individually movable upon at least three axes comprises each thermal actuator capable of movement upon three axes, including movement upon an X axis laterally left and laterally right and further including movement upon a Y axis anterior and posterior, and further including movement upon a Z axis vertically up and down.

21. The method of claim 18, wherein electrically interfacing the test probes with the functional silicon devices for testing comprises:
 lowering the test interface units having the test probes affixed thereto in a vertical plane toward the thermal actuator units under the control of the device handler; and
 raising the thermal actuator units having the plurality of functional silicon devices to be tested set thereupon in the vertical plane toward the test probes of the test interface units under the control of the device handler.

22. The method of claim 18, further comprising performing one or more alignment operations, each of the one or more alignment operations comprising at least one of:
 (i) a pitch alignment operation, wherein each thermal actuator is further capable of independent pitch adjustment relative to the plurality of test interface units having a fixed pitch and wherein the device handler is to align test probes affixed to the test interface units with the plurality of functional silicon devices to be tested further comprises the handler to align the test probes to the plurality of functional silicon devices by independently adjusting a pitch of each of the plurality of thermal actuators as controlled by the device handler based on inputs from the plurality of downward facing cameras and wherein the pitch of each of the plurality of thermal actuators is adjusted prior to the device handler electrically interfacing the test probes to the plurality of functional silicon devices to be tested;
 (ii) a macro alignment operation, wherein the pick and place units are to perform the macro alignment under the control of the device handler and based at least in part on the optically located position of the plurality of test interface units by the upward facing camera and wherein placement of the functional silicon devices to be tested upon the thermal actuators relative to the test interface units are within hundreds of microns of alignment after the macro alignment by the pick and place heads;
 (iii) a fine alignment operation, wherein each of the thermal actuators are to independently move to perform the fine alignment operation in parallel under the control of the device handler and based at least in part on the optically located position of each one of the plurality of functional silicon devices the plurality by the downward facing cameras and wherein electrical contacts of the functional silicon devices to be tested are brought into a fine alignment within tens of microns by the independent movement of the thermal actuators; and
 a second fine alignment operation, wherein the second fine alignment operation further adjusts the thermal actuators through independent movement under the control of the device handler based on optical capture and identification of a plurality of electrical contacts of the plurality of functional silicon devices and offsets to the plurality of electrical contacts of each of the functional silicon devices from one or more edges or corners of each of the functional silicon devices.

23. A device handling system, comprising:
 a non-transitory computer readable media having instructions stored thereupon;
 a processor to execute the instructions;
 a plurality of test interface units to electrically interface to the functional silicon devices for test;
 a plurality of thermal actuators, each being individually movable upon at least three axes;
 an optical alignment unit with a plurality of pick and place head pairs, wherein the optical alignment unit is to move upon a horizontal plane and is to move between the plurality of test interface units and the plurality of thermal actuators;
 an upward facing camera to move with the optical alignment unit, the upward facing camera to optically locate a position of the plurality of test interface units;
 a plurality of downward facing cameras, each to optically locate a position of one of the plurality of functional silicon devices to be tested upon one of the plurality of thermal actuators;
 wherein the instructions, when executed by the processor of the system, cause the optical alignment unit to perform operations including:
 moving the optical alignment unit between the plurality of test interface units and the plurality of thermal actuators;
 placing one of the plurality of functional silicon devices upon each of the plurality of thermal actuators via the pick and place head pairs;
 optically locating a position of the plurality of test interface units via an upward facing camera of the device handler which moves with the optical alignment unit;
 optically locating a position of each one of the plurality of functional silicon devices to be tested via a plurality of downward facing cameras;
 retracting the optical alignment unit from between the plurality of test interface units and the plurality of thermal actuators under the control of the device handler;
 aligning test probes affixed to the test interface units with the plurality of functional silicon devices to be tested; and
 electrically interfacing the test probes with the functional silicon devices for testing.

24. The system of claim 23,
 wherein the optical alignment unit when positioned between the plurality of test interface units and the plurality of thermal actuators is positioned such that the plurality of test interface units are above the optical alignment unit and the plurality of thermal actuators are positioned below the optical alignment unit; and
 wherein the optical alignment unit to move upon a horizontal plane comprises the optical alignment unit to move in at least two axes, including movement upon an X axis laterally left and laterally right and further including movement upon a Y axis anterior and posterior, and wherein the optical alignment unit does not move upon a Z axis, vertically up or down.

25. The system of claim 23, wherein electrically interfacing the test probes with the functional silicon devices for testing comprises the instructions causing the optical alignment unit to perform further operations including:

lowering the test interface units having the test probes affixed thereto in a vertical plane toward the thermal actuator units under the control of the device handler; and raising the thermal actuator units having the plurality of functional silicon devices to be tested set thereupon in the vertical plane toward the test probes of the test interface units under the control of the device handler.

\* \* \* \* \*